(12) United States Patent
Chu et al.

(10) Patent No.: US 11,476,365 B2
(45) Date of Patent: Oct. 18, 2022

(54) FIN FIELD EFFECT TRANSISTOR DEVICE STRUCTURE AND METHOD FOR FORMING THE SAME

(71) Applicant: Taiwan Semiconductor Manufacturing Co., Ltd., Hsinchu (TW)

(72) Inventors: Chia-Hung Chu, Taipei (TW); Sung-Li Wang, Zhubei (TW); Fang-Wei Lee, Hsinchu (TW); Jung-Hao Chang, Taichung (TW); Mrunal Abhijith Khaderbad, Hsinchu (TW); Keng-Chu Lin, Ping-Tung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/744,480

(22) Filed: Jan. 16, 2020

(65) Prior Publication Data
US 2021/0226057 A1     Jul. 22, 2021

(51) Int. Cl.
*H01L 29/78* (2006.01)
*H01L 29/08* (2006.01)
*H01L 29/45* (2006.01)
*H01L 21/311* (2006.01)
*H01L 29/417* (2006.01)
(Continued)

(52) U.S. Cl.
CPC .... *H01L 29/7851* (2013.01); *H01L 21/31116* (2013.01); *H01L 21/823418* (2013.01); *H01L 21/823475* (2013.01); *H01L 29/0847* (2013.01); *H01L 29/41791* (2013.01); *H01L 29/45* (2013.01); *H01L 29/66795* (2013.01); *H01L 21/0274* (2013.01); *H01L 21/3065* (2013.01); *H01L 21/3081* (2013.01); *H01L 21/31053* (2013.01); *H01L 21/31111* (2013.01); *H01L 21/31144* (2013.01); *H01L 21/32139* (2013.01); *H01L 21/76224* (2013.01);
(Continued)

(58) Field of Classification Search
CPC .............. H01L 21/823475; H01L 21/823418
See application file for complete search history.

(56) References Cited

U.S. PATENT DOCUMENTS

8,772,109 B2   7/2014  Colinge
8,785,285 B2   7/2014  Tsai et al.
(Continued)

*Primary Examiner* — Farun Lu
(74) *Attorney, Agent, or Firm* — Birch, Stewart, Kolasch & Birch, LLP (57) ABSTRACT

A method for forming a fin field effect transistor device structure includes forming a fin structure over a substrate. The method also includes forming a gate structure across the fin structure. The method also includes growing a source/drain epitaxial structure over the fin structure. The method also includes depositing a first dielectric layer surrounding the source/drain epitaxial structure. The method also includes forming a contact structure in the first dielectric layer over the source/drain epitaxial structure. The method also includes depositing a second dielectric layer over the first dielectric layer. The method also includes forming a hole in the second dielectric layer to expose the contact structure. The method also includes etching the contact structure to enlarge the hole in the contact structure. The method also includes filling the hole with a conductive material.

20 Claims, 8 Drawing Sheets

(51) Int. Cl.
    *H01L 29/66*     (2006.01)
    *H01L 21/8234*     (2006.01)
    *H01L 21/308*     (2006.01)
    *H01L 21/027*     (2006.01)
    *H01L 21/3065*     (2006.01)
    *H01L 21/762*     (2006.01)
    *H01L 21/3105*     (2006.01)
    *H01L 21/3213*     (2006.01)

(52) U.S. Cl.
    CPC .... *H01L 29/6656* (2013.01); *H01L 29/66545* (2013.01); *H01L 29/7848* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,083,863 B1 * | 9/2018 | Hsieh ................ H01L 21/32134 |
| 2018/0182856 A1 * | 6/2018 | Lee ..................... H01L 23/5226 |
| 2019/0214559 A1 * | 7/2019 | Clarke ................ H01L 45/1253 |
| 2020/0006131 A1 * | 1/2020 | Shimabukuro ... H01L 21/76849 |
| 2020/0090944 A1 * | 3/2020 | Lee .................. H01L 21/76843 |
| 2020/0111675 A1 * | 4/2020 | Takatsuki .......... C23C 16/45525 |

\* cited by examiner

FIN FIELD EFFECT TRANSISTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2B-1, 2B-2, 2C-1, 2C-2 are cross-sectional representations of various stages of forming a FinFET device structure, in accordance with some embodiments of the disclosure.

FIGS. 3-1 and 3-2 are cross-sectional representations of a stage of forming a modified FinFET device structure, in accordance with some embodiments of the disclosure.

FIGS. 4-1 and 4-2 are cross-sectional representations of a stage of forming a modified FinFET device structure, in accordance with some embodiments of the disclosure.

FIGS. 5-1 and 5-2 are cross-sectional representations of a stage of forming a modified FinFET device structure, in accordance with some embodiments of the disclosure.

FIGS. 6-1 and 6-2 are cross-sectional representations of a stage of forming a modified FinFET device structure, in accordance with some embodiments of the disclosure.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include forming a rivet-shaped via structure over a contact structure. The contact structure may be chemically etched back to form the rivet portion of the via structure. The interface area between the via structure and the contact structure may be enlarged, and the contact resistivity may be reduced. By using chemical etching, the via profile may be well controlled. Moreover, the rivet-shaped via structure may protect the contact structure beneath during subsequent planarization process. The contact structure corrosion may be prevented since slurry leakage in the planarization process can be avoided.

Figure 1:
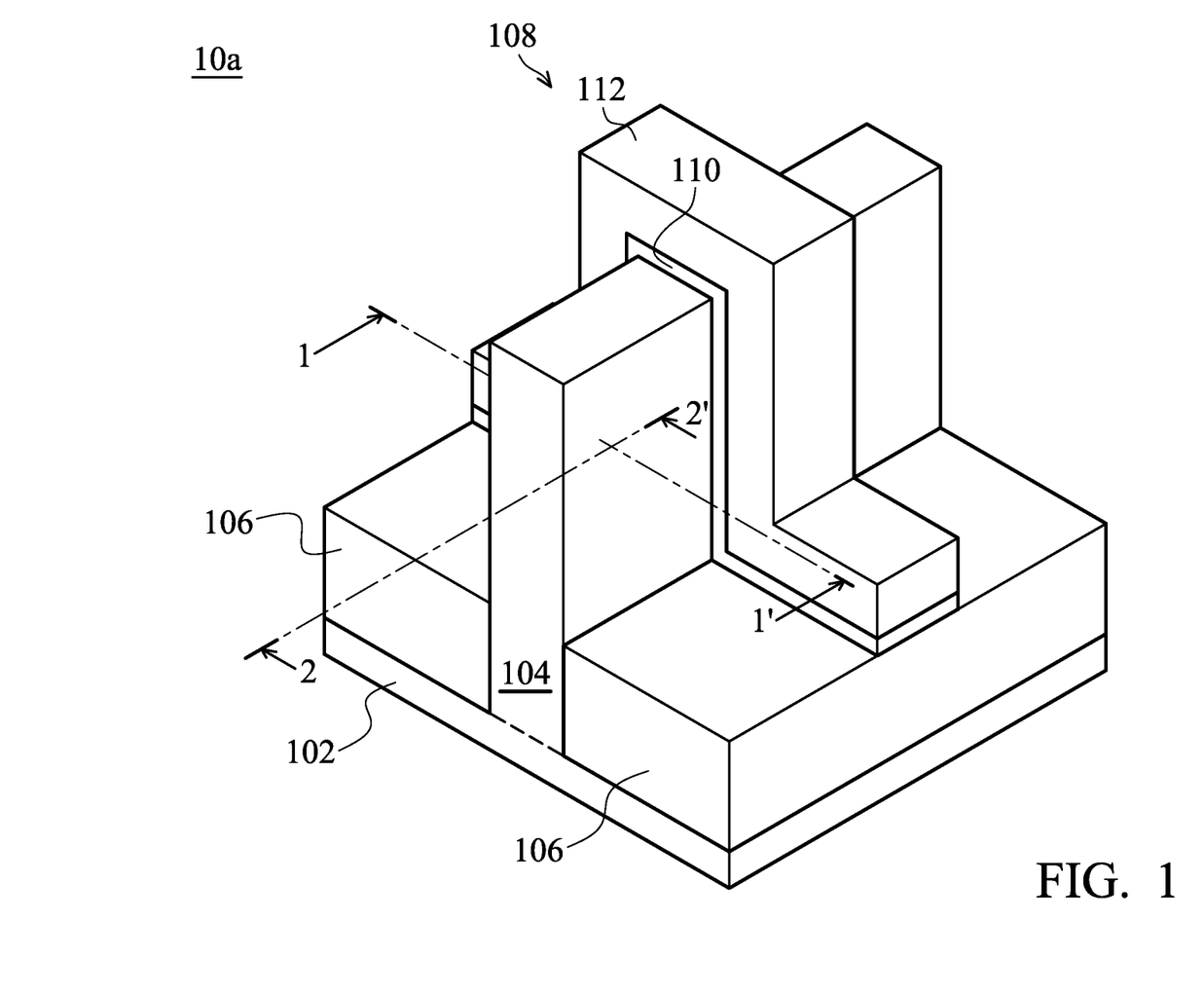
FIG. 1 is a perspective representation of a FinFET device structure, in accordance with some embodiments of the disclosure.

FIG. 1 is a perspective representation of a FinFET device structure 10a, in accordance with some embodiments of the disclosure. FIGS. 2A-1, 2A-2, 2B-1, 2B-2, 2C-1, 2C-2 are cross-sectional representations of various stages of forming a FinFET device structure 10a, in accordance with some embodiments of the disclosure. FIGS. 2A-1, 2B-1, 2C-1 show cross-sectional representations taken along line 1-1' in FIG. 1. FIGS. 2A-2, 2B-2, 2C-2 show cross-sectional representations taken along line 2-2' in FIG. 1.

Figure 2A:
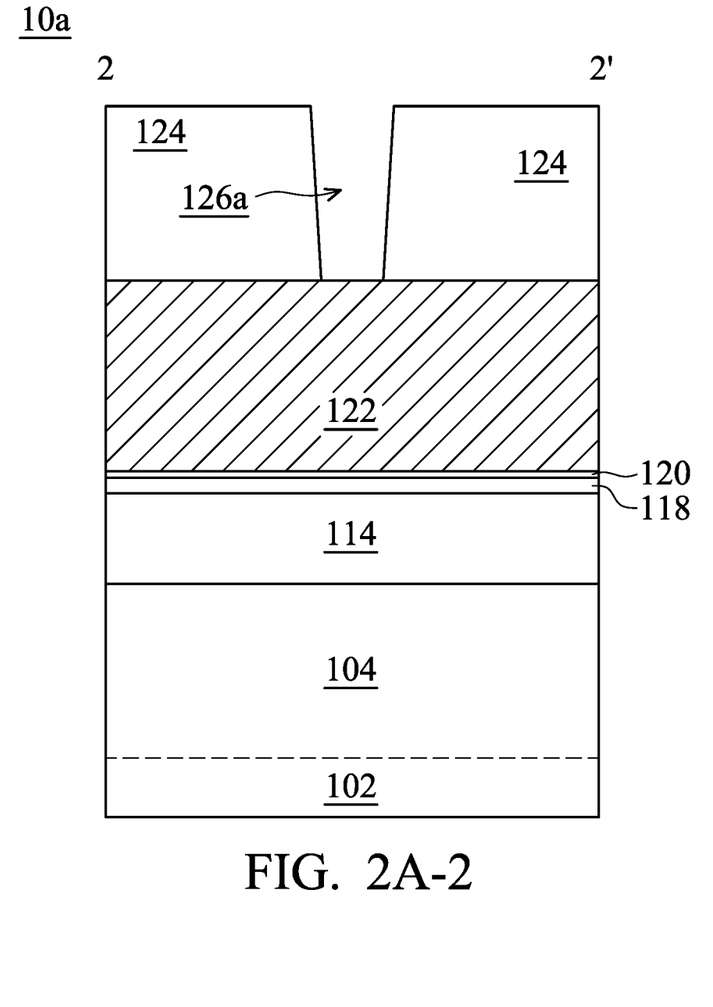

A substrate 102 is provided as shown in FIGS. 1, 2A-1, and 2A-2 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1, 2A-1, and 2A-2 in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them. The interface is shown as a dashed line.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIGS. 1, 2A-1, and 2A-2 in accordance with some embodiments. In some embodiments, the isolation layer 106 is made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1, 2A-1, and 2A-2 in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIG. 1 in accordance with some embodiments. In some embodiments, the gate structure 108 includes a gate dielectric layer 110 and a gate electrode layer 112. In some embodiments, the gate dielectric layer 110 is a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on the opposite sides of the gate structure 108.

Next, a pair of spacers are formed on opposite sidewalls of the gate structure 108 (not shown). The spacers may be made of silicon oxide, silicon nitride, silicon oxynitride, and/or dielectric materials. In some embodiments, the spacers are formed by a chemical vapor deposition (CVD) process, a spin-on-glass process, or another applicable process.

Afterwards, the top portion of the fin structure 104 exposed on the opposite sides of the gate structure 108 may be removed in an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 114 is formed in the recess over the fin structure 104 on opposite sides of the gate structure 108, as shown in FIGS. 2A-1 and 2A-2 in accordance with some embodiments. A strained material may be grown in the recess by an epitaxial (epi) process to form the source/drain epitaxial structure 114. In addition, the lattice constant of the strained material may be different from the lattice constant of the substrate 102. The source/drain epitaxial structure 114 may include Ge, SiGe, InAs, InGaAs, InSb, GaAs, GaSb, InAlP, InP, SiC, SiP, other applicable materials, or a combination thereof. The source/drain epitaxial structure 114 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 114 is formed, a first inter-layer dielectric (ILD) structure 116 is formed to cover the source/drain epitaxial structure 114, as shown in FIGS. 2A-1 and 2A-2 in accordance with some embodiments. In some embodiments, the first ILD structure 116 surrounds the fin structure 104 and the source/drain epitaxial structure 114.

Figure 2A:
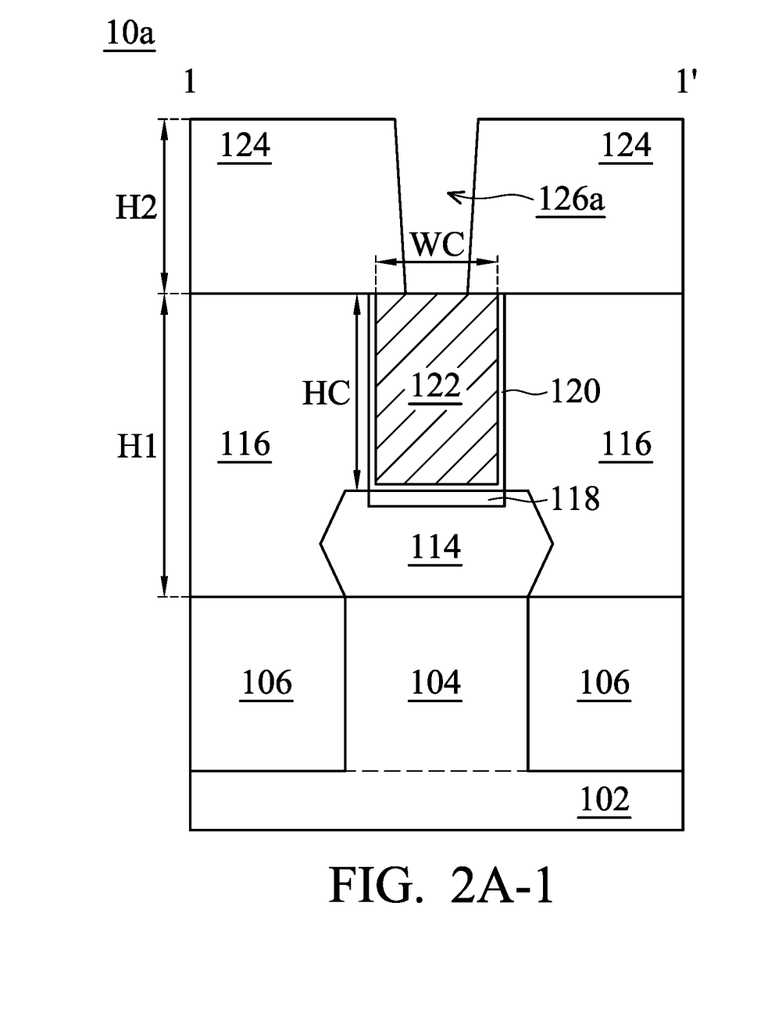

The first ILD structure 116 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 116 may be formed by chemical vapor deposition (CVD), spin-on coating, or other applicable processes.

Afterwards, a planarizing process is performed on the first ILD structure 116 until the top surface of the gate structure 108 is exposed (not shown). After the planarizing process, the top surface of the gate structure 108 may be substantially level with the top surfaces of the spacers and the first ILD structure 116. The planarizing process may include a grinding process, a chemical mechanical polishing (CMP) process, an etching process, other applicable processes, or a combination thereof.

As shown in FIG. 2A-1, the thickness H1 of first ILD structure 116 is in a range of about 10 nm to about 60 nm. If the first ILD structure 116 is too thick, it may be difficult to subsequently form a contact structure and the contact resistance may increase. If the first ILD structure 116 is too thin, it may increase the parasitic capacitance and the subsequently formed contact structures may spike due to electromigration.

Afterwards, a patterning and an etching process are performed to form a hole in the first ILD structure 116 by using a patterned photoresist layer as a mask (not shown). The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 114 may be exposed from the hole.

Next, a metal semiconductor compound layer 118 may be formed over the source/drain epitaxial structure 114, as shown in FIGS. 2A-1 and 2A-2 in accordance with some embodiments. The metal semiconductor compound layer 118 may reduce the contact resistance between the source/drain epitaxial structure 114 and the subsequently formed contact structure over the source/drain epitaxial structure 114. The metal semiconductor compound layer 118 may be made of titanium silicide ($TiSi_2$), nickel silicide (NiSi), cobalt silicide (CoSi), or other suitable low-resistance materials. The metal semiconductor compound layer 118 may be formed over the source/drain epitaxial structure 114 by forming a metal layer over the source/drain epitaxial structure 114 first. The metal layer may react with the source/drain epitaxial structure 114 in an annealing process and a metal semiconductor compound layer 118 may be produced.

Afterwards, the unreacted metal layer may be removed in an etching process and the metal semiconductor compound layer 118 may be left.

In some embodiments, a barrier layer 120 is optionally conformally formed over the bottom surface and the sidewalls of the hole, as shown in FIGS. 2A-1 and 2A-2 in accordance with some embodiments. The barrier layer 120 may be formed before filling the conductive material in the hole to prevent the conductive material from diffusing into the first ILD structure 116. The barrier layer 120 may also serve as an adhesive or glue layer. The material of the barrier layer 120 may be TiN, Ti, other applicable materials, or a combination thereof. The barrier layer 120 may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a contact structure 122 is formed in the hole, as shown in FIGS. 2A-1 and 2A-2 in accordance with some embodiments. As shown in FIGS. 2A-1 and 2A-2, the contact structure 122 is formed in the first ILD structure 116 and over the source/drain epitaxial structure 114. As shown in FIGS. 2A-1 in accordance with some embodiments, the barrier layer 120 conformally wraps the contact structure 122. The contact structure 122 may be made of metal materials (e.g., W, Mo, or Co), metal alloys, other applicable conductive materials, or a combination thereof. The contact structure 122 may be formed by a chemical vapor deposition process (CVD), a physical vapor deposition process (PVD, e.g., evaporation or sputter), an atomic layer deposition process (ALD), an electroplating process, other suitable processes, or a combination thereof to deposit the conductive materials of the contact structure 122, and then optionally perform a chemical mechanical polishing (CMP) process or an etch back process to remove excess conductive materials.

As shown in FIG. 2A-1, the thickness HC of the contact structure 122 is in a range of about 15 nm to about 40 nm. If the contact structure 122 is too thick, it may be difficult to subsequently form a via structure, and the resistance may increase. If the contact structure 122 is too thin, there may not be enough space for a subsequently formed rivet-shaped via structure and it may increase the resistance.

In addition, as shown in FIG. 2A-1, the width WC of the contact structure 122 is in a range of about 15 nm to about 30 nm. If the contact structure 122 is too wide, it may short-circuit with adjacent elements, and the contact structure 122 may extrude due to electromigration. If the contact structure 122 is too narrow, it may be difficult to form the contact structure 122 and the contact resistance may increase.

Afterwards, an etch stop layer may be optionally deposited over the first ILD structure 116 and the contact structure 122 (not shown). The etch stop layer may include $SiO_2$, $Si_3N_4$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, or $Ta_2O_5$, the like, or a combination thereof. The etch stop layer may be formed by depositing dielectric materials by a chemical vapor deposition process (CVD) (such as a plasma enhanced chemical vapor deposition (PECVD) process, a high density plasma chemical vapor deposition (HDPCVD)), an atomic layer deposition (ALD) process, and/or other suitable techniques to deposit dielectric materials.

Next, a second ILD structure 124 is blanketly formed over the gate structure 108, the first ILD structure 116, and the contact structure 122, as shown in FIGS. 2A-1 and 2A-2 in accordance with some embodiments. The materials and processes for forming the second ILD structure 124 may be the same as, or similar to, those used to form the first ILD structure 116. For the purpose of brevity, the descriptions of these processes are not repeated herein.

As shown in FIG. 2A-1, the thickness H2 of second ILD structure 124 is in a range of about 10 nm to about 60 nm. If the second ILD structure 124 is too thick, it may be difficult to subsequently form a via structure and the resistance may increase. If the second ILD structure 124 is too thin, it may increase the parasitic capacitance and the contact structure 122 may spike due to electromigration.

Next, a hole 126a is formed in the second ILD structure 124, as shown in FIGS. 2A-1 and 2A-2 in accordance with some embodiments. The processes for forming the hole 126a may be the same as, or similar to, those used to form the hole in the first ILD structure 116. For the purpose of brevity, the descriptions of these processes are not repeated herein. During the process of forming the hole 126a, the etch stop layer between the first ILD structure 116 and the second ILD structure 124 (if exists) may be etched away. After forming the hole 126a, the top surface of the contact structure 122 is exposed from the hole 126a, as shown in FIGS. 2A-1 and 2A-2 in accordance with some embodiments.

Next, the hole 126a is enlarged in the contact structure 122 as a hole 126b by etching back the contact structure 122, as shown in FIGS. 2B-1 and 2B-2 in accordance with some embodiments. In some embodiments, the etching process 128 includes a chemical etching process, which will be described later. The contact structure 122 has a concave top surface 122S after the etching process 128 is performed, as shown in FIGS. 2B-1 and 2B-2 in accordance with some embodiments.

Figure 2B:
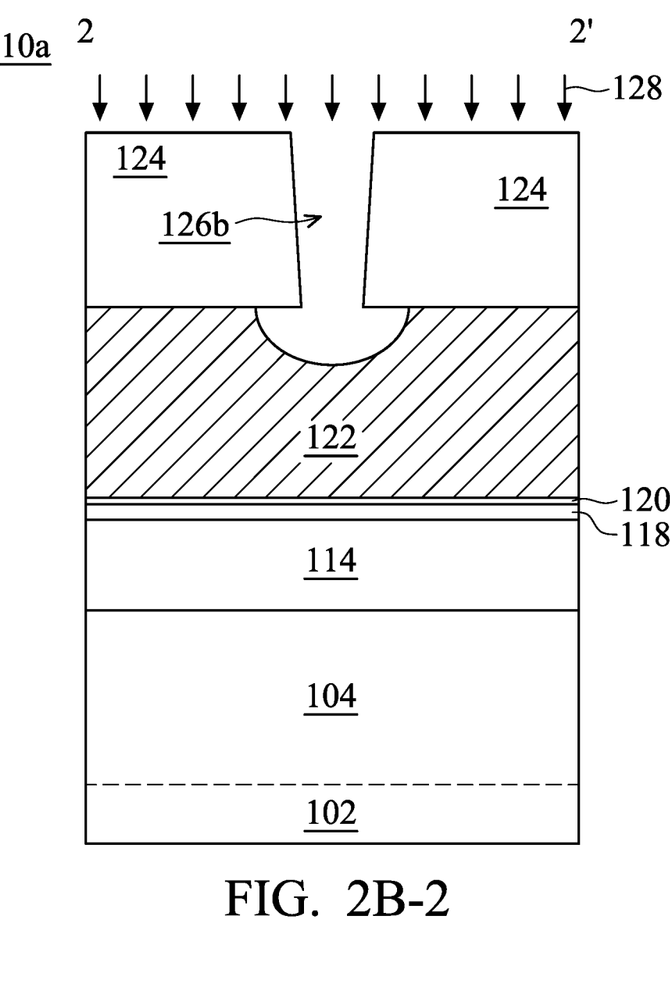
Figure 2B:
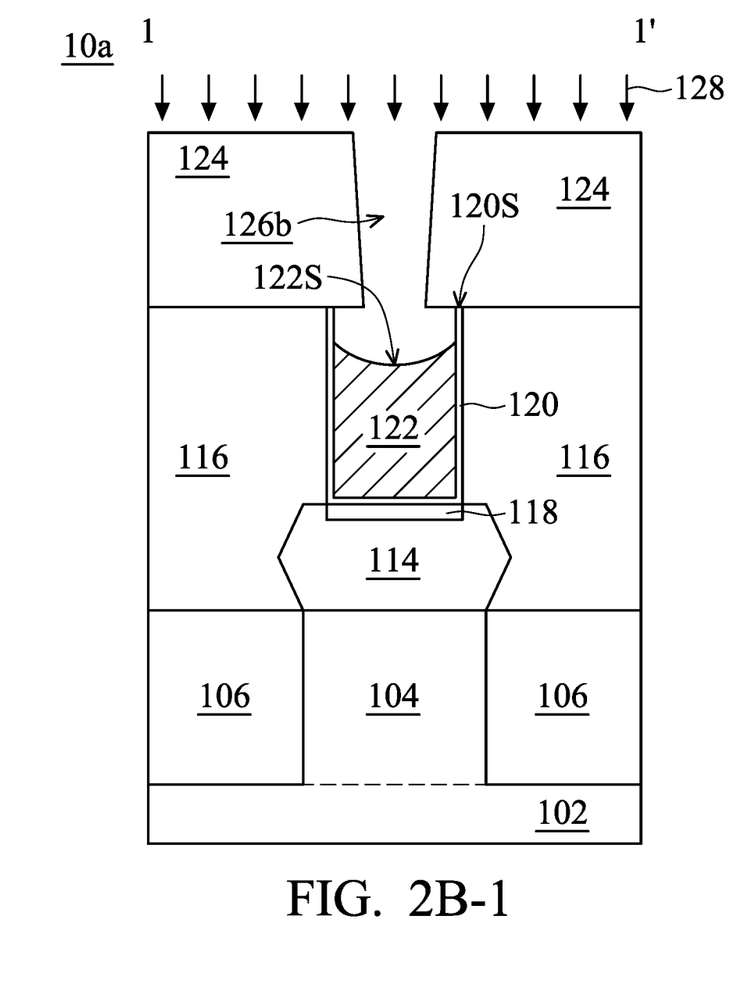

In some embodiments, the etching process 128 etching back the contact structure 122 includes cyclic performing a plasma etching process and a soaking process. In some embodiments, the plasma etching process includes using oxygen and the soaking process comprises using $WF_6$. The oxygen in the plasma etching process may react with the metal (such as tungsten) of the contact structure 122. The product of the reaction may be replaced by $WF_6$ in the soaking process. Therefore, the contact structure 122 is isotropically etched in the etching process 128, as shown in FIGS. 2B-1 and 2B-2 in accordance with some embodiments. In addition, the contact structure 122 may have a concave top surface 122S. Moreover, since the oxygen may not react with the material of the barrier layer 120, the barrier layer 120 may remain after etching the contact structure 122. In some embodiments as shown in FIGS. 2B-1 and 2B-2, the top surface 122S of the contact structure 122 is below the top surface 120S of the barrier layer 120.

In some embodiments, the etching of the contact structure 122 is performed at a temperature in a range of about 360° C. to about 440° C. within a range of about 1 cycle to about 5 cycles. In some embodiments, during the etching of the contact structure 122, the pressure of the oxygen is in a range of about 1 Torr to about 9 Torr, and the pressure of the $WF_6$ is in a range of about 0.1 Torr to about 5 Torr. If the temperature or the pressure are too high or with too many cycles, the hole 126b in the contact structure may be too deep. The aspect ratio of the hole 126b may be too large and it may be difficult for subsequently conductive material filling. If the temperature or the pressure are too low or have too few cycles, the hole 126b in the contact structure may be too small. The exposed area of the contact structure 122 may not be big enough, and the resistance may increase.

Next, a via structure 130 is formed by filling the hole 126b with a conductive material, as shown in FIGS. 2C-1 and 2C-2 in accordance with some embodiments. Since the hole 126b is enlarged in the contact structure 122, the via structure 130 has a rivet portion 130R surrounded by the first ILD structure 116 as shown in FIGS. 2C-1 and 2C-2. Moreover, the via structure 130 is formed over the contact structure 122 as shown in FIGS. 2C-1 and 2C-2.

Figure 2C:
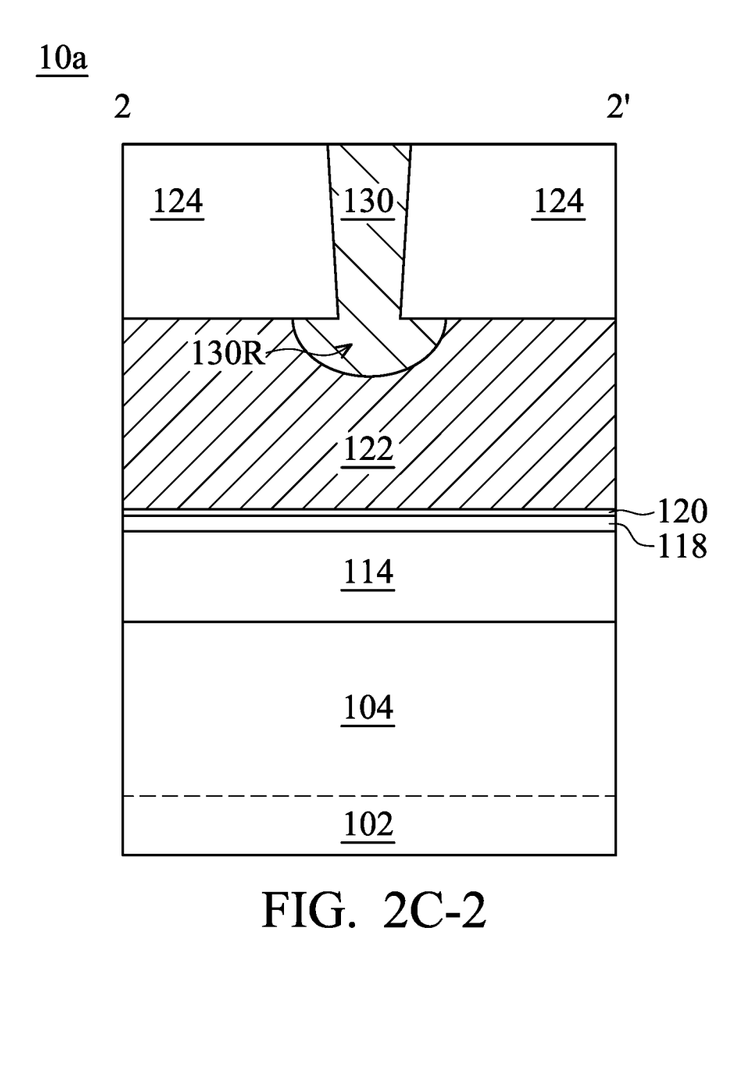
Figure 2C:
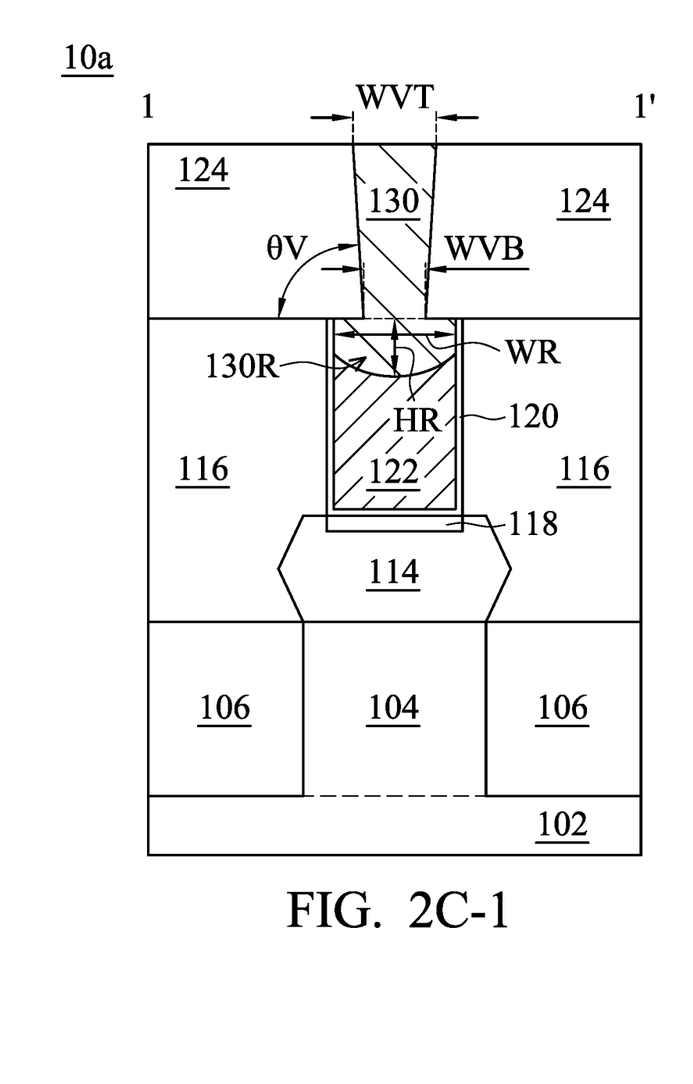

The via structure 130 may be made of metal materials (e.g., Ru, Ir, Rh, W, or Mo), metal alloys, other applicable conductive materials, or a combination thereof. The via structure 130 may be formed by a chemical vapor deposition process (CVD), a physical vapor deposition process (PVD), e.g., evaporation or sputter), an atomic layer deposition process (ALD), an electroplating process, other suitable processes, or a combination thereof to deposit the conductive materials in the hole 126b, and then optionally perform a chemical mechanical polishing (CMP) process or an etch back process to remove excess conductive materials.

The rivet portion 130R of the via structure 130 may enlarge the interface area between the via structure 130 and the contact structure 122, and the resistance may decrease. Moreover, while perform the planarization process to remove excess conductive materials of the via structure 130, the rivet portion 130R of the via structure 130 may protect the contact structure 122 beneath. Therefore, the slurry used in the planarization process may not leak to the contact structure 122 and the contact structure 122 may not be corroded.

In some embodiments, the via structure 130 is formed by a conformally and bottom-up depositing process. With a bottom-up depositing process, it may avoid forming a necking profile of the via structure 130, and the production yield may be improved. With a conformally depositing process, the adhesion between the via structure 130 and the second ILD structure 124 may be better.

In some embodiments, the via structure 130 is made of Ru (ruthenium), and the via structure formed by a chemical vapor deposition process (CVD) with the reaction: $Ru_3(CO)_{12(g)}$+heat→$3Ru+12CO$. The via structure 130 is formed at a temperature in a range of about 135° C. to about 195° C. If the reaction temperature is too high, the deposition may be too fast and there may be an early merged void in the via structure 130. If the reaction temperature is too low, the deposition may be too slow, and it may cost more production time to achieve the desired profile of the via structure 130 and the sidewall adhesion may be weak.

In some embodiments, the via structure 130 includes a single layer of conductive material with less activity, such as a barrierless Ru. Ru may not be easily diffused out of the via structure 130, and therefore no barrier layer is needed when forming the via structure 130. The interface resistance of the via structure 130 may be reduced without forming the barrier layer.

As shown in FIG. 2C-1, the bottom width WVB of via structure 130 is in a range of about 8 nm to about 20 nm. If the bottom width WVB of via structure 130 is too wide, the adhesion between the via structure 130 and the second ILD structure 124 may be worse. If the bottom width WVB of via structure 130 is too narrow, it may not be easy to fill the hole 126a with a conductive material. As shown in FIG. 2C-1, the top width WVT of via structure 130 is in a range of about 8 nm to about 30 nm. If the top width WVT of via structure 130 is too wide, the via structure 130 may short-circuit with adjacent elements. If the top width WVT of via structure 130 is too narrow, it may not be easy to fill the hole 126a with a conductive material. As shown in FIG. 2C-1, the sidewall angle θV of the via structure 130 is in a range of about 80° to about 89°. If the sidewall angle θV is too steep, it may cause damage in the pre-clean process when forming the via structure 130. If the sidewall angle θV is too taper, the via structure 130 may short-circuit with adjacent elements.

As shown in FIG. 2C-1, the height HR of the rivet portion 130R of the via structure 130 is in a range of about 2 nm to about 15 nm. If the rivet portion 130R of the via structure 130 is too deep, if may be difficult to fill conductive material in the hole 126b, and a seam may be formed in the via structure 130. If the rivet portion 130R of the via structure 130 is too shallow, the interface area between the via structure 130 and the contact structure 122 may be too small, and the contact resistance may increase.

As shown in FIG. 2C-1, the width WR of the rivet portion 130R of the via structure 130 is in a range of about 10 nm to about 20 nm. If the rivet portion 130R of the via structure 130 is too wide, it may be difficult to fill conductive material in the hole 126b. If the rivet portion 130R of the via structure 130 is too narrow, the slurry of subsequent planarization process may leak to the contact structure 122 and the contact structure 122 may corrode.

By forming a via structure 130 with a rivet portion 130R with a chemical etching process, the interface area between the via structure 130 and the contact structure 122 may be increase, and the resistance may be reduced. Moreover, the rivet portion 130R of the via structure 130 may protect the contact structure 122 beneath from corrosion during a subsequent planarization process. With cyclic plasma etching processes and soaking processes using oxygen and $WF_6$ respectively, the metal (such as tungsten) of the conduct material may be etched back, and a rivet-shaped via structure 130 with barrierless Ruthenium may be formed.

Figure 31:
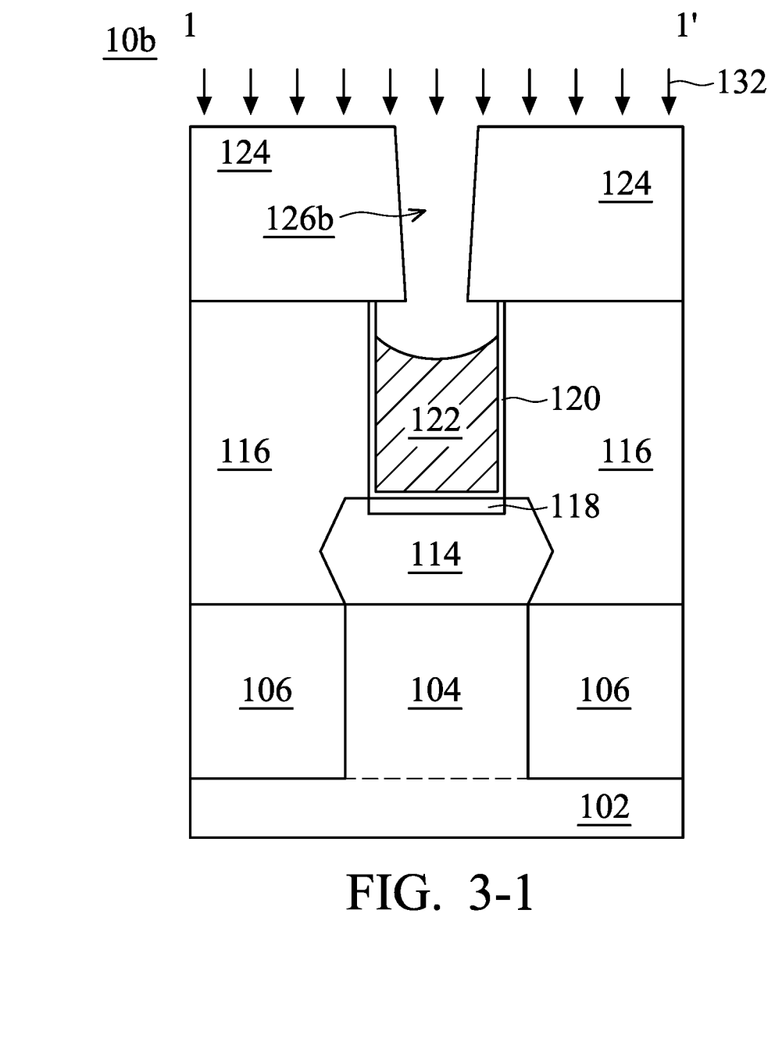
Figure 32:
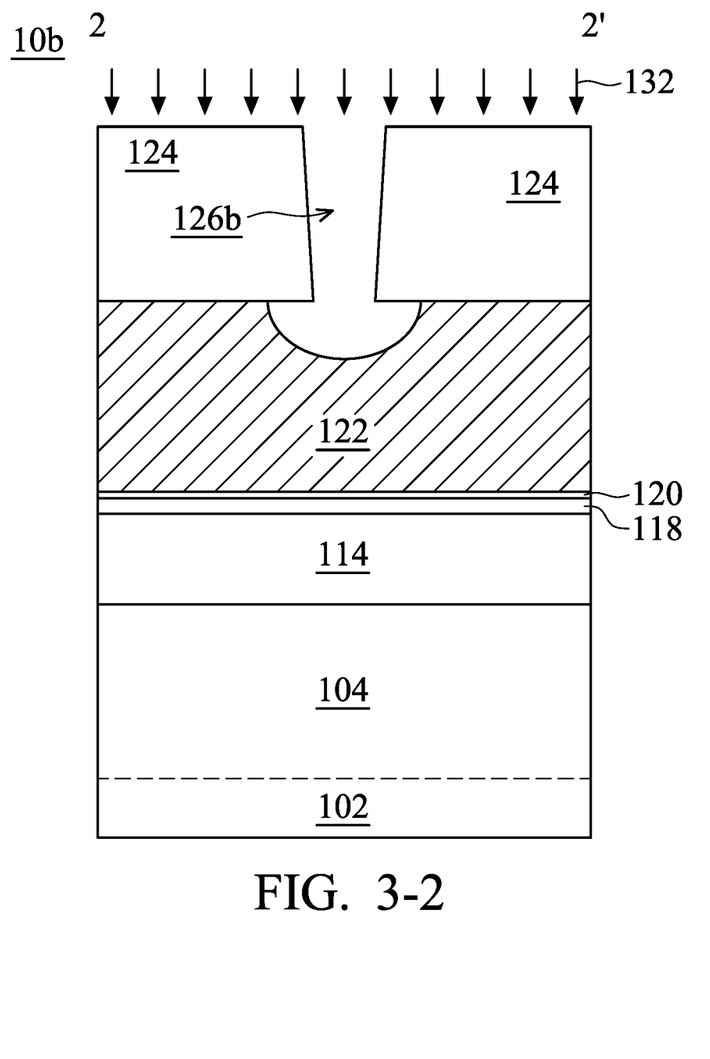

Many variations and/or modifications may be made to the embodiments of the disclosure. FIGS. 3-1 and 3-2 are cross-sectional representations of a stage of forming a modified FinFET device structure 10b, in accordance with some embodiments of the disclosure. FIG. 3-1 shows a cross-sectional representation taken along line 1-1' in FIG. 1. FIG. 3-2 show a cross-sectional representation taken along line 2-2' in FIG. 1. Some processes or devices are the same as, or similar to, those described in the embodiments above, and therefore the descriptions of these processes and devices are not repeated herein. The difference from the embodiments described above is that, as shown in FIGS. 3-1 and 3-2 in accordance with some embodiments, the hole is enlarged in the contact structure 122 as a hole 126b by a chemical etching process 132.

In some embodiments, the etching process 132 etching the contact structure 122 includes using $ClF_3$ in a nitrogen ambient. In some embodiments, $ClF_3$ reacts with the metal of the contact structure 122. In some embodiments, the contact structure 122 includes W (tungsten), and W and $WO_3$ in the contact structure 122 are etched with the following reaction: $2ClF_3+W→WF_6+O_2$ and $2ClF_3+WO_3→WF_6+3/2O_2+Cl_2$. In some embodiments, the etching process 132 is performed at a temperature in a range of about 150° C. to about 250° C. and a pressure in a range of about 2 Torr to about 6 Torr for in a range of about 2 seconds to about 30 seconds. For example, the etching process 132 may be performed under 200° C. and 4 Torr for 8 seconds. If the temperature or the pressure are too high or duration is too long, the hole 126b in the contact structure may be too deep. The aspect ratio of the hole 126b may be too large and it may be difficult for subsequently conductive material filling. If the temperature or the pressure are too low or duration is too short, the hole 126*b* in the contact structure may be too small. The contact structure 122 may not have enough of an exposed area, and the resistance may increase.

The etching process 132 is performed under a lower temperature. Therefore, the etching process 132 may have less impact on the thermal budget. In addition, the ClF$_3$ used in the etching process 132 may not react with oxygen. Therefore, the profile first ILD structure 116 and the second ILD structure 124 may keep the same during the etching process 132.

By forming a via structure 130 with a rivet portion 130R with a chemical etching process, the interface area between the via structure 130 and the contact structure 122 may be increase, and the resistance may be reduced. Moreover, the rivet portion 130R of the via structure 130 may protect the contact structure 122 beneath from corrosion during a subsequent planarization process. Using ClF$_3$ in the etching process 132 enlarging the hole 126*b*, there may be less impact with on the thermal budget. In addition, the profile of the first ILD structure 116 and the second ILD structure 124 may keep the same.

Figure 41:
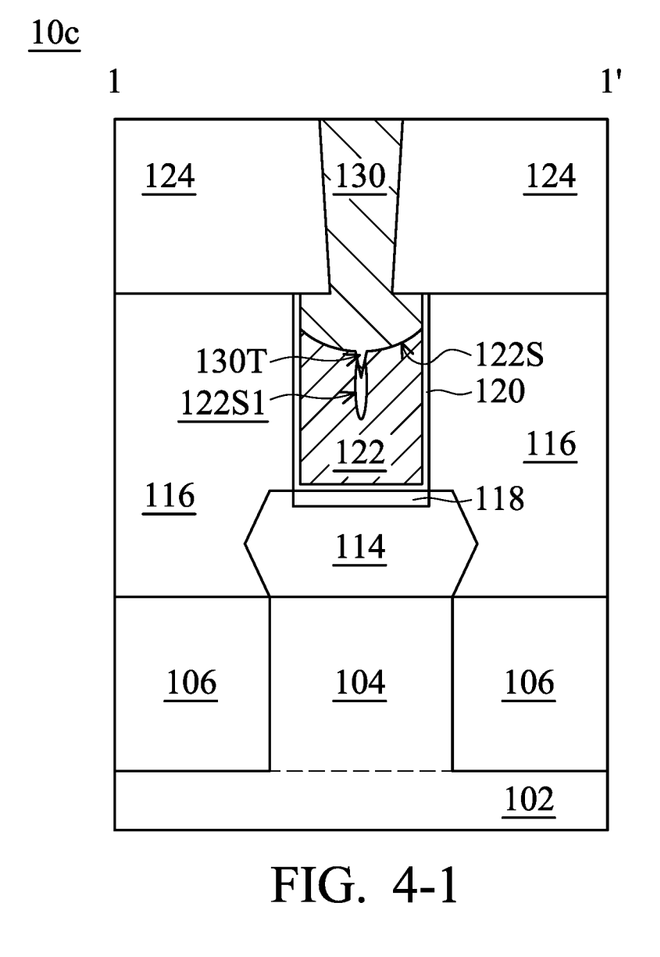
Figure 42:
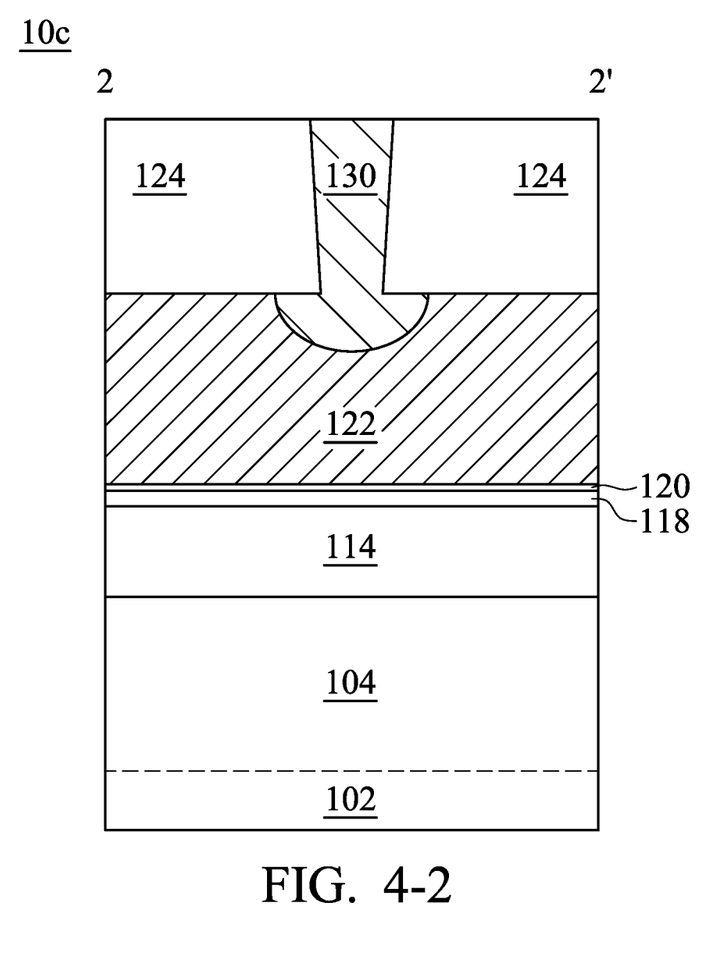

Many variations and/or modifications may be made to the embodiments of the disclosure. FIGS. 4-1 and 4-2 are cross-sectional representations of a stage of forming a modified FinFET device structure 10*c*, in accordance with some embodiments of the disclosure. FIG. 4-1 shows a cross-sectional representation taken along line 1-1' in FIG. 1. FIG. 4-2 show a cross-sectional representation taken along line 2-2' in FIG. 1. Some processes or devices are the same as, or similar to, those described in the embodiments above, and therefore the descriptions of these processes and devices are not repeated herein. The difference from the embodiments described above is that, as shown in FIGS. 4-1 and 4-2 in accordance with some embodiments, there is a seam 122S1 in the contact structure 122. A seam 122S1 may be formed during conformally growing the contact structure 122.

As shown in FIGS. 4-1 and 4-2 in accordance with some embodiments, the contact structure 122 with a seam 122S1 is etched with either the etching process 128 or the etching process 132. Therefore, the top of the seam 122S1 may be open after the etching process 128/132. After that, the via structure 130 is formed in the hole 126*b* over the contact structure 122. As shown in FIGS. 4-1 and 4-2 in accordance with some embodiments, with the seam 122S1 of the contact structure 122, the via structure 130 has a tip portion 130T protruding through the concave top surface 122S of the contact structure 122. As shown in FIGS. 4-1 and 4-2 in accordance with some embodiments, the tip portion 130T of the via structure 130 has a needle shape.

The tip portion 130T of the via structure 130 may partially fill the seam 122S1 of the contact structure 122. Therefore, the contact structure 122 below the tip portion 130T of the via structure 130 may be separated. With the tip portion 130T of the via structure 130, the contact resistance may be reduced. Furthermore, with conductive material with a good gap filling capability, the tip portion 130T of the via structure 130 may substantially fill up the seam 122S1 of the contact structure 122. Therefore, the contact resistance may be further reduced.

By forming a via structure 130 with a rivet portion 130R with a chemical etching process, the interface area between the via structure 130 and the contact structure 122 may increase, and the resistance may be reduced. Moreover, the rivet portion 130R of the via structure 130 may protect the contact structure 122 beneath from corrosion during a subsequent planarization process. A tip portion 130T of the via structure 130 protruding through the top surface 122S of the contact structure 122 may substantially fully or partially fill the seam 122S1 formed in the contact structure 122 and reduce the contact resistance.

Figure 51:
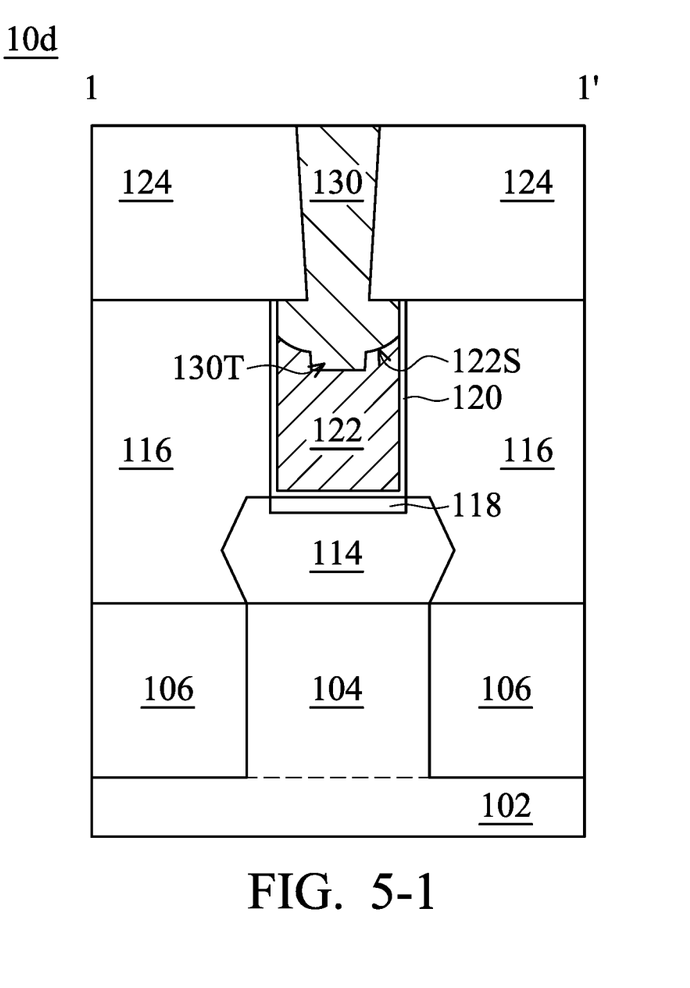
Figure 52:
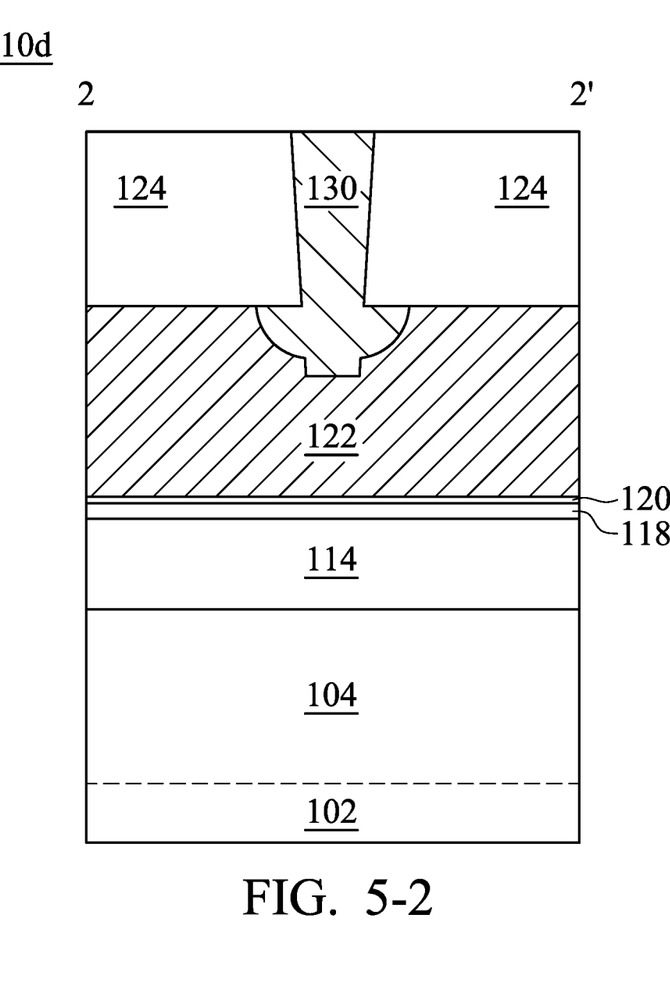

Many variations and/or modifications may be made to the embodiments of the disclosure. FIGS. 5-1 and 5-2 are cross-sectional representations of a stage of forming a modified FinFET device structure 10*d*, in accordance with some embodiments of the disclosure. FIG. 5-1 shows a cross-sectional representation taken along line 1-1' in FIG. 1. FIG. 5-2 show a cross-sectional representation taken along line 2-2' in FIG. 1. Some processes or devices are the same as, or similar to, those described in the embodiments above, and therefore the descriptions of these processes and devices are not repeated herein. The difference from the embodiments described above is that, as shown in FIGS. 5-1 and 5-2 in accordance with some embodiments, a bombardment process is performed after etching the top surface 122S of the contact structure 122. Therefore, the via structure 130 has a tip portion 130T protruding through the concave top surface 122S of the contact structure 122. As shown in FIGS. 5-1 and 5-2 in accordance with some embodiments, the tip portion 130T of the via structure 130 has a U-shape.

As shown in FIGS. 5-1 and 5-2 in accordance with some embodiments, after etching back the contact structure 122 with either the etching process 128 or the etching process 132, the top surface 122S is further etched using a bombardment process. Therefore, the byproduct of the etching process 128/132 may be cleaned. Moreover, the interface area between the contact structure 122 and the via structure 130 is enlarged due to the formation of the tip portion 130T. In some embodiments, the bombardment process includes using argon.

In some embodiments, the bombardment process is performed with power in a range of about 700 W to about 1400 W. In some embodiments, the bombardment process is performed at a temperature in a range of about 25° C. to about 75° C. and a pressure in a range of about 1 mTorr to about 30 mTorr. For example, the bombardment process may be performed at 900 W, at 30° C. and 5 mTorr for 7.3 seconds.

If the power of the bombardment process is too high, there may be arcing between the shower head and the wafer stage of the process chamber, and this may cause particles which may lower the production yield. If the power of the bombardment process is too low, the bombardment may be scattered and the profile of the top surface 122S may be a necking profile. If the pressure of the bombardment process is too high, the ion directionality may be worse due to the ion mean free path is too short and the ions may not collimate, therefore the via structure 130 may have a necking profile easily. If the pressure of the bombardment process is too low, the mean free path of argon may be too short. The bombardment may be scattered and the profile of the top surface 122S may be a necking profile. If the duration of the bombardment process is too long, the protruding portion 130T of the via structure 130 may be too large. Therefore, it may be hard to fill conductive material of the via structure 130. If the duration of the bombardment process is too short, the protruding portion 130T of the via structure 130 may be too small and the interface between the contact structure 122 and the via structure 130 may not be enough.

With a U-shaped tip portion 130T of the via structure 130 as shown in FIGS. 5-1 and 5-2 in accordance with some embodiments, the interface between area between the via structure 130 and the contact structure 122 may further increase, and the resistance may be further reduced.

By forming a via structure 130 with a rivet portion 130R with a chemical etching process, the interface area between the via structure 130 and the contact structure 122 may increase, and the resistance may be reduced. Moreover, the rivet portion 130R of the via structure 130 may protect the contact structure 122 beneath from corrosion during a subsequent planarization process. An extra bombardment process may be performed before forming the via structure 130. Therefore, the byproduct of the previous etching process may be cleaned. Moreover, a U-shaped tip portion 130T of the via structure 130 may be formed, which may enlarge the interface area between the via structure 130 and the contact structure 122, and the contact resistance may be reduced.

Figure 61:
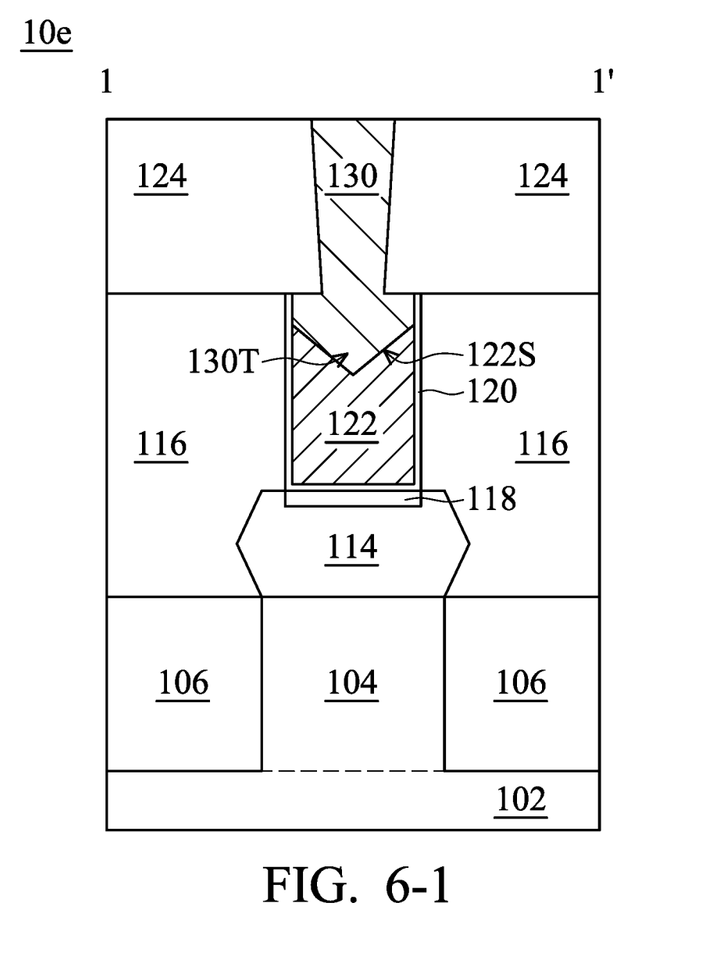
Figure 62:
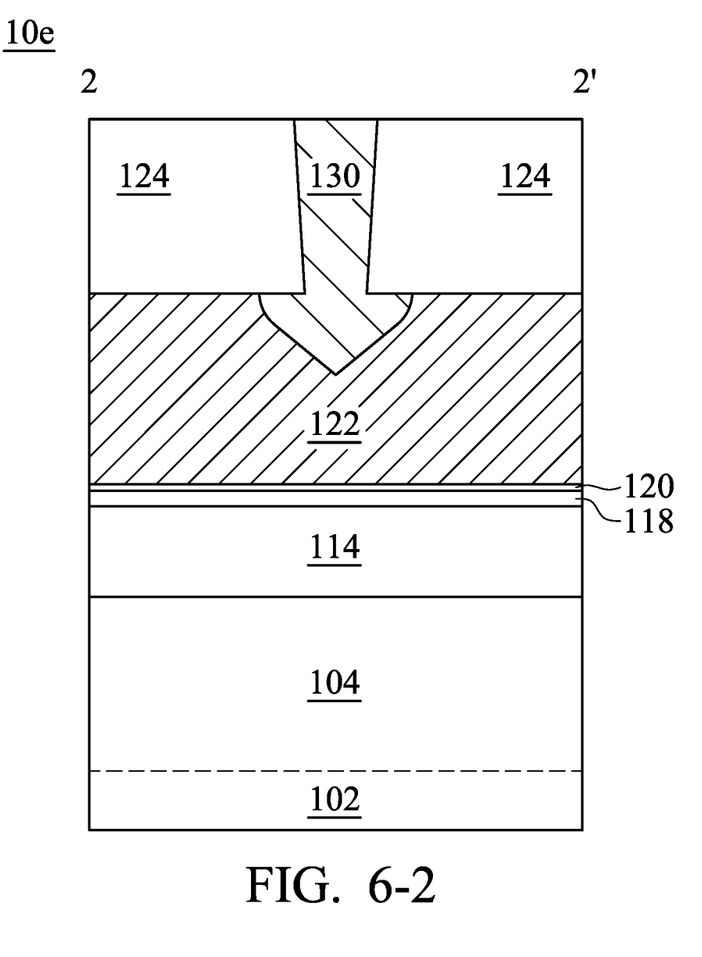

Many variations and/or modifications may be made to the embodiments of the disclosure. FIGS. 6-1 and 6-2 are cross-sectional representations of a stage of forming a modified FinFET device structure 10e, in accordance with some embodiments of the disclosure. FIG. 6-1 shows a cross-sectional representation taken along line 1-1' in FIG. 1. FIG. 6-2 show a cross-sectional representation taken along line 2-2' in FIG. 1. Some processes or devices are the same as, or similar to, those described in the embodiments above, and therefore the descriptions of these processes and devices are not repeated herein. The difference from the embodiments described above is that, as shown in FIGS. 6-1 and 6-2 in accordance with some embodiments, a bombardment process is performed after etching the top surface 122S of the contact structure 122. Therefore, the via structure 130 has a tip portion 130T protruding through the concave top surface 122S of the contact structure 122. As shown in FIGS. 6-1 and 6-2 in accordance with some embodiments, the tip portion 130T of the via structure 130 has a V-shape.

As shown in FIGS. 6-1 and 6-2 in accordance with some embodiments, after etching back the contact structure 122 with either the etching process 128 or the etching process 132, the top surface 122S is further etched in a bombardment process. Therefore, the byproduct of the etching process 128/132 may be cleaned. Moreover, the interface area between the contact structure 122 and the via structure 130 is enlarged due to the formation of the tip portion 130T. In some embodiments, the bombardment process includes using argon.

With a V-shaped tip portion 130T of the via structure 130 as shown in FIGS. 6-1 and 6-2 in accordance with some embodiments, the interface between area between the via structure 130 and the contact structure 122 may further increase, and the resistance may be further reduced.

By forming a via structure 130 with a rivet portion 130R with a chemical etching process, the interface area between the via structure 130 and the contact structure 122 may increase, and the resistance may be reduced. Moreover, the rivet portion 130R of the via structure 130 may protect the contact structure 122 beneath from corrosion during a subsequent planarization process. An extra bombardment process may be performed before forming the via structure 130. Therefore, the byproduct of a previous etching process may be cleaned. Moreover, a V-shaped tip portion 130T of the via structure 130 may be formed, which may enlarge the interface area between the via structure 130 and the contact structure 122, and the contact resistance may be reduced.

As described previously, a rivet-shaped via structure 130 with a rivet portion 130R may enlarge the interface area between the via structure 130 and the contact structure 122. The resistance may be reduced. Moreover, the rivet portion 130R of the via structure 130 may protect the contact structure 122 beneath. In some embodiments as shown in FIGS. 2B-1/2B-2 and 3-1/3-2, different chemical etching processes are used to form the rivet portion 130R of the rivet-shaped via structure 130. In some embodiments as shown in FIGS. 4-1 and 4-2, the seam 122S1 of the contact structure 122 is filled by the via structure 130 and the resistance is therefore reduced. In some embodiments as shown in FIGS. 5-1/5-2 and 6-1/6-2, a tip portion 130T of the via structure 130 formed in a bombardment process further enlarges the interface area between the via structure 130 and the contact structure 122 and the resistance is further reduced.

Embodiments of a FinFET device structure and a method for forming the same are provided. The method for forming the FinFET device structure may include forming a rivet-shaped via structure over a contact structure. The contact structure may be chemically etched back to form the rivet portion of the via structure. The interface area between the contact structure and the via structure may be enlarged by the rivet portion of the via structure, and the resistance may be reduced. In addition, the contact structure may be protected by the rivet portion of the via structure in the subsequent process.

In some embodiments, a method for forming a fin field effect transistor device structure is provided. The method for forming a fin field effect transistor device structure includes forming a fin structure over a substrate. The method for forming a fin field effect transistor device structure also includes forming a gate structure across the fin structure. The method for forming a fin field effect transistor device structure also includes growing a source/drain epitaxial structure over the fin structure. The method for forming a fin field effect transistor device structure also includes depositing a first dielectric layer surrounding the source/drain epitaxial structure. The method for forming a fin field effect transistor device structure also includes forming a contact structure in the first dielectric layer over the source/drain epitaxial structure. The method for forming a fin field effect transistor device structure also includes depositing a second dielectric layer over the first dielectric layer. The method for forming a fin field effect transistor device structure also includes forming a hole in the second dielectric layer to expose the contact structure. The method for forming a fin field effect transistor device structure also includes etching the contact structure to enlarge the hole in the contact structure. The method for forming a fin field effect transistor device structure also includes filling the hole with a conductive material.

In some embodiments, a method for forming a fin field effect transistor device structure is provided. The method for forming a fin field effect transistor device structure includes forming a fin structure over a substrate. The method for forming a fin field effect transistor device structure also includes growing a source/drain epitaxial structure over the fin structure. The method for forming a fin field effect transistor device structure also includes depositing a first dielectric layer surrounding the source/drain epitaxial structure. The method for forming a fin field effect transistor device structure also includes forming a first hole in the first dielectric layer over the source/drain epitaxial structure. The method for forming a fin field effect transistor device structure also includes conformally forming a barrier layer in the first hole over a bottom surface and sidewalls of the first hole. The method for forming a fin field effect transistor device structure also includes filling the first hole with a conductive material to form a contact structure. The method for forming a fin field effect transistor device structure also includes chemically etching back the contact structure. The method for forming a fin field effect transistor device structure also includes forming a via structure over the contact structure.

In some embodiments, a fin field effect transistor device structure is provided. The fin field effect transistor device structure includes a fin structure formed over a substrate. The fin field effect transistor device structure also includes a source/drain epitaxial structure formed over the fin structure. The fin field effect transistor device structure also includes a contact structure with a concave top surface formed over the source/drain epitaxial structure. The fin field effect transistor device structure also includes a barrier layer conformally wrapped around the contact structure. The fin field effect transistor device structure also includes a via structure formed over the contact structure. The concave top surface of the contact structure is below the top surface of the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor device structure, comprising:
   forming a fin structure over a substrate;
   forming a gate structure across the fin structure;
   growing a source/drain epitaxial structure over the fin structure;
   depositing a first dielectric layer surrounding the source/drain epitaxial structure;
   forming a contact structure in the first dielectric layer over the source/drain epitaxial structure;
   depositing a second dielectric layer over the first dielectric layer;
   forming a hole in the second dielectric layer to expose the contact structure;
   etching the contact structure by using $ClF_3$ in a nitrogen ambient to enlarge the hole in the contact structure; and
   filling the hole with a conductive material,
   wherein a bottom portion of the hole is wider than a top portion of the hole.

2. The method for forming the fin field effect transistor device structure as claimed in claim 1, wherein the contact structure comprises tungsten and the conductive material comprises ruthenium.

3. The method for forming the fin field effect transistor device structure as claimed in claim 1, wherein etching the contact structure is performed at a temperature in a range of about 150° C. to about 250° C. and a pressure in a range of about 2 Torr to about 6 Torr for in a range of about 2 seconds to about 30 seconds.

4. A method for forming a fin field effect transistor device structure, comprising:
   forming a fin structure over a substrate;
   growing a source/drain epitaxial structure over the fin structure;
   depositing a first dielectric layer surrounding the source/drain epitaxial structure;
   forming a first hole in the first dielectric layer over the source/drain epitaxial structure;
   conformally forming a barrier layer in the first hole over a bottom surface and sidewalls of the first hole;
   filling the first hole with a conductive material to form a contact structure;
   chemically etching back the contact structure using $ClF_3$ in a nitrogen ambient; and
   forming a via structure over the contact structure.

5. The method for forming the fin field effect transistor device structure as claimed in claim 4, wherein the contact structure has a concave top surface after chemically etching back the contact structure.

6. The method for forming the fin field effect transistor device structure as claimed in claim 4, wherein forming the via structure comprises:
   depositing a second dielectric layer over the first dielectric layer;
   forming a second hole over the contact structure; and
   conformally and bottom-up depositing a conductive material in the second hole.

7. The method for forming the fin field effect transistor device structure as claimed in claim 4, wherein the via structure is formed in a seam in the contact structure.

8. The method for forming the fin field effect transistor device structure as claimed in claim 4, further comprising:
   further etching a top surface of the contact structure using a bombardment process.

9. The method for forming the fin field effect transistor device structure as claimed in claim 8, wherein after the bombardment process, a portion of the top surface of the contact structure has a V-shape or a U-shape.

10. The method for forming the fin field effect transistor device structure as claimed in claim 8, wherein the bombardment process comprises using argon.

11. A method for forming a fin field effect transistor device structure, comprising:
    forming a fin structure over a substrate;
    forming a gate structure across the fin structure;
    growing a source/drain epitaxial structure beside the gate structure;
    depositing a first dielectric layer surrounding and over the source/drain epitaxial structure;
    forming a contact structure in the first dielectric layer over the source/drain epitaxial structure;
    depositing a second dielectric layer over the contact structure;
    forming a hole in the second dielectric layer to expose the contact structure;
    etching the contact structure by using $ClF_3$ in a nitrogen ambient to enlarge the hole in the contact structure; and
    forming a via structure in the hole,
    wherein the via structure comprises a top portion, a bottom portion below the top portion, and a tip portion below the bottom portion, the top portion, the bottom portion, and the tip portion are made of a same material, the bottom portion is wider than both the top portion and the tip portion, the bottom portion has a curved bottom surface, and the tip portion has a substantially flat bottom surface.

12. The method for forming the fin field effect transistor device structure as claimed in claim 11, wherein the contact structure and the via structure are made of different materials.

13. The method for forming the fin field effect transistor device structure as claimed in claim 11, wherein the bottom portion of the via structure is surrounded by the first dielectric layer, and the top portion of the via structure is surrounded by the second dielectric layer, wherein a top surface of the bottom portion of the via structure is wider than a bottom surface of the top portion of the via structure.

14. The method for forming the fin field effect transistor device structure as claimed in claim 13, wherein the bottom portion of the via structure has straight sidewalls perpendicular to a top surface of the first dielectric layer.

15. The method for forming the fin field effect transistor device structure as claimed in claim 11, further comprising:
bombarding a bottom surface of the hole after enlarging the hole in the contact structure.

16. The method for forming the fin field effect transistor device structure as claimed in claim 11, wherein etching the contact structure comprises performing a plasma etching process and a soaking process, wherein the plasma etching process comprises using oxygen and the soaking process comprises using WF6, wherein etching the contact structure is performed at a temperature in a range of about 360° C. to about 440° C. within a range of about 1 cycle to about 5 cycles, and a pressure of oxygen is in a range of about 1 Torr to about 9 Torr, and a pressure of WF6 is in a range of about 0.1 Torr to about 5 Torr.

17. The method for forming the fin field effect transistor device structure as claimed in claim 11, wherein the bottom portion and the tip portion of the via structure are in contact with the contact structure.

18. The method for forming the fin field effect transistor device structure as claimed in claim 11, wherein a thickness of the bottom portion of the via structure is greater than a thickness of the tip portion of the via structure.

19. The method for forming the fin field effect transistor device structure as claimed in claim 11, further comprising:
a barrier layer surrounding the via structure and the contact structure.

20. The method for forming the fin field effect transistor device structure as claimed in claim 19, wherein the bottom portion of the via structure is in contact with the barrier layer, and the tip portion of the via structure is separated from the barrier layer.

* * * * *